United States Patent
Seong (10) Patent No.: US 8,932,890 B2
(45) Date of Patent: Jan. 13, 2015

(54) VERTICAL-STRUCTURE SEMICONDUCTOR LIGHT EMITTING ELEMENT AND A PRODUCTION METHOD THEREFOR

(75) Inventor: Tae Yeon Seong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 30 days.

(21) Appl. No.: 13/505,618

(22) PCT Filed: Nov. 23, 2010

(86) PCT No.: PCT/KR2010/008281
§ 371 (c)(1), (2), (4) Date: May 2, 2012

(87) PCT Pub. No.: WO2011/065723
PCT Pub. Date: Jun. 3, 2011

(65) Prior Publication Data
US 2012/0220063 A1   Aug. 30, 2012

(30) Foreign Application Priority Data
Nov. 25, 2009   (KR) .................. 10-2009-0114801

(51) Int. Cl.
H01L 21/00   (2006.01)
H01L 33/64   (2010.01)
H01L 33/00   (2010.01)

(52) U.S. Cl.
CPC ........... *H01L 33/647* (2013.01); *H01L 33/0079* (2013.01)
USPC .................................. 438/46; 438/22; 438/33

(58) Field of Classification Search
USPC ............................................. 438/22, 33, 46
See application file for complete search history.

(56) References Cited

U.S. PATENT DOCUMENTS

| 7,821,018 | B2* | 10/2010 | Osawa et al. .................. 257/90 |
| 2001/0016369 | A1* | 8/2001 | Zandman et al. ............. 438/106 |
| 2002/0148113 | A1* | 10/2002 | Forrest et al. .................. 29/847 |
| 2004/0149810 | A1* | 8/2004 | Yang et al. .................... 228/175 |

(Continued)

FOREIGN PATENT DOCUMENTS

| JP | 2004-095959 A | 3/2004 |
| KR | 10-0609119 B1 | 8/2006 |

(Continued)

OTHER PUBLICATIONS

Korean Office Action dated May 17, 2011 issued in Application No. 10-2009-0114801.

(Continued)

*Primary Examiner* — Charles Garber
*Assistant Examiner* — Brigitte Paterson
(74) *Attorney, Agent, or Firm* — Ked & Associates, LLP (57) ABSTRACT

The present invention relates to a vertical-structure semiconductor light emitting device and a production method thereof, more specifically, to a vertical-structure semiconductor light emitting device having a high-performance heat sink support comprising a thick metal film or metal foil. The vertical-structure semiconductor light emitting element produced in accordance with the present invention constitutes a highly reliable light emitting element with absolutely no thermal or mechanical damage since it has the high performance heatsink support and so suffers not fine micro-cracking and can be freely subjected to heat treatment and to post-processing including of a side-surface passivation thin film.

18 Claims, 6 Drawing Sheets

(56) References Cited

U.S. PATENT DOCUMENTS

| | | | | |
|---|---|---|---|---|
| 2004/0191939 | A1* | 9/2004 | Kon et al. | 438/22 |
| 2005/0062061 | A1* | 3/2005 | Horng et al. | 257/103 |
| 2005/0269588 | A1* | 12/2005 | Kim et al. | 257/99 |
| 2007/0045640 | A1* | 3/2007 | Erchak et al. | 257/98 |
| 2007/0134826 | A1* | 6/2007 | Baik et al. | 438/22 |
| 2008/0023691 | A1* | 1/2008 | Jang et al. | 257/13 |
| 2008/0099776 | A1* | 5/2008 | Lee et al. | 257/98 |
| 2008/0164480 | A1* | 7/2008 | Kang et al. | 257/76 |
| 2008/0173885 | A1* | 7/2008 | Kuromizu | 257/98 |
| 2008/0211103 | A1* | 9/2008 | Hotta et al. | 257/762 |
| 2008/0258133 | A1* | 10/2008 | Seong | 257/14 |
| 2008/0274571 | A1* | 11/2008 | Ogihara et al. | 438/21 |
| 2009/0014738 | A1* | 1/2009 | Shiue et al. | 257/98 |
| 2009/0311817 | A1* | 12/2009 | Yoon et al. | 438/38 |

FOREIGN PATENT DOCUMENTS

| | | |
|---|---|---|
| KR | 10-2008-0018084 A | 2/2008 |
| KR | 10-2008-0047838 A | 5/2008 |
| KR | 10-2008-0087135 A | 9/2008 |
| KR | 10-0872276 B1 | 12/2008 |
| KR | 10-2009-0104808 A | 10/2009 |
| KR | 10-2009-0116410 A | 11/2009 |
| WO | WO 2007/086366 A1 | 8/2007 |

OTHER PUBLICATIONS

Korean Notice of Allowance dated Sep. 11, 2012 issued in Application No. 10-2009-0114801.

International Search Report dated Aug. 2, 2011 issued in Application No. PCT/KR2010/008281.

Taiwanese Office Action issued in Application No. 099140661 dated May 31, 2013.

* cited by examiner

VERTICAL-STRUCTURE SEMICONDUCTOR LIGHT EMITTING ELEMENT AND A PRODUCTION METHOD THEREFOR

TECHNICAL FILED

Embodiments of the invention may relate to a vertical-structure semiconductor light emitting device and a method for fabricating the same, more particularly, to a vertical-structure semiconductor light emitting device that includes a high-performance heat sink support having a metallic thick film or metallic foil.

BACKGROUND

Generally, a semiconductor light emitting device generates light when a forward current is applied thereto such as light emitting diode (LED) and a laser diode (LD). Especially, such an LED and LD have a p-n junction and a current applied to those light emitting devices is converted into a photon, to emit light from the devices.

The lights emitted from the LED and the LD may include various lights at a long wavelength to a short wavelength based on the types of the semiconductor devices. Above all, an LED fabricated of a semiconductor having a wide band gap can be used for realizing red, green and blue colors that consists of a visible area. Accordingly, those LEDs have been broadly and industrially applied to displaying parts of various electronic devices, streetlights and various display light source devices. In recent, a white light source has been developed through the LED and it is certain that the LEDs will be broadly used in light source devices for next generation common lighting.

Generally, a III-V nitride based semiconductor is fabricated after heteroepitaxially growing on an initial growth substrate to gain a good quality semiconductor thin film. Sapphire, SiC and Si have been used for such an initial growth substrate.

Out of the materials used for the initial growth substrate, a sapphire substrate has a predetermined lattice constant and thermal expansion coefficient that are quite different from a lattice constant and thermal expansion coefficient of the III-V nitride based semiconductor. Accordingly, it is difficult to layer multi-layered light emitting structure thin films configured of a good quality III-V nitride based semiconductor. In addition, the sapphire substrate has a deteriorating thermal conductivity and it results in having a disadvantage of failure in applying a high current to an LED. Also, the sapphire substrate is an electric insulator that has difficulties in dealing with external static electricity and it has a considerable disadvantage of potential error possibility that might be caused by the static electricity. Those disadvantages might deteriorate device reliability and cause quite limitation on a packaging process.

Moreover, the sapphire substrate that is an electric insulator has a MESA-structure formed in the same direction as a layering (growing) direction of a multilayered light emitting structure thin film configured of an n-type ohmic contact electrode and a p-type ohmic contact electrode. Also, the sapphire substrate requires an LED chip area that is a predetermined value or more. Accordingly, there is limitation on reducing the LED chip area and restriction on enhancing the LED chip production output per 2-inch wafer.

Rather than those disadvantages, the MESA-structured LED fabricated on the sapphire substrate that is the initial growth substrate has a further disadvantage of difficulties in dissipating much heat necessarily generated during the driving of a light emitting device, because of bad thermal conductivity.

As a result, it is limited to apply the MESA structure having sapphire attached thereto to the light emitting device used for large-area and high-capacity (namely, high-currents) such as a large-sized display and a light source for general lighting. In other words, if high currents are injected to a light emitting device for a long time, much heat will be generated and the heat will make the temperature inside a light emitting active layer to gradually increase. Accordingly, there might be a disadvantage of gradually decreased LED light emitting efficiency.

Different from the sapphire substrate, a silicon carbide (SiC) substrate has good thermal and electric conductivity. The lattice constant and thermal expansion coefficient of the III-V nitride based semiconductor are similar to a lattice constant and thermal expansion coefficient of the SiC that are important factors when growing a good quality semiconductor single-crystal thin film. Accordingly, a good quality light emitting structure thin film may grow successfully and various types of vertical-structure light emitting devices have been fabricated, using the multilayer light emitting structure thin film.

However, it is not easy to fabricate the good quality SiC growth substrate and the SiC growth substrate is quite high-cost, compared with the other growth substrates such as the sapphire substrate, such that it may have much limitation on application to mass production.

As a result, considering current technological, economic and efficient aspects, it is preferable to fabricate a light emitting device by using the multilayer light emitting structure thin film including the III-V nitride based semiconductor growing and disposed on the sapphire substrate.

To solve the disadvantages of the MESA-structure LED fabricated by using the multilayer light emitting structure thin film configured of the III-V nitride based semiconductor growing and disposed on the initial growth substrate as mentioned above, recently, there have been a lot of effort put into fabricating a vertical-structure light emitting structure by using the multilayer light emitting structure thin film consisting of the III-V nitride based semiconductor that is separated from the initial growth substrate safely after the multilayer light emitting structure thin film consisting of a good quality III-V nitride based semiconductor grows on an initial growth substrate such as a sapphire substrate, SiC substrate and Si substrate.

Figure 1:
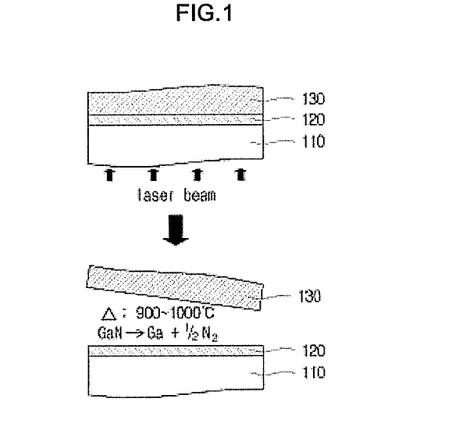
FIG. 1 is a sectional view illustrating a process of separating a sapphire substrate based on Laser Lift-Off technique according to a related art.

FIG. 1 is a sectional view illustrating a process of separating a sapphire substrate based on Laser Lift-Off technique according to a related art.

As shown in FIG. 1, a laser beam as a strong energy source is irradiated to a back side of a transparent sapphire substrate 110 based on Laser Lift-Off technique. After that, laser beam absorption is strongly generated in an interface 120 and 900° C. or more may be temporarily generated to perform thermochemical decomposition. Accordingly, a nitride thin film 130 is separated from the sapphire substrate 110.

However, as mentioned in many related documents, the multilayer light emitting structure consisting of the III-V nitride based semiconductor cannot endure a mechanical stress generated between the III-V nitride based semiconductor thin film and the thick sapphire substrate because of the different lattice constants and thermal expansion coefficients, in the Laser Lift-Off process. Accordingly, more damage and braking might be generated on a semiconductor single-layer thin film separated from the sapphire.

If the damage and braking is generated in the multilayered light emitting structure thin film, many leaky currents might be generated and also, a chip yield of light emitting devices such as LEDs might be degraded and entire performance of LED chips as light emitting devices might be degraded. Accordingly, there have been steadily studied on a sapphire substrate separation process that is able to minimize damage on the multilayered light emitting structure thin film and on a fabricating process of a vertical-structure LED, using the separated multilayered light emitting structure thin film.

As a result, when separating the sapphire substrate in the laser lift-off process, there have been suggested various proposals to minimize the damage and braking of the multilayered light emitting structure consisting of the III-V nitride based semiconductor thin films.

Figure 2:
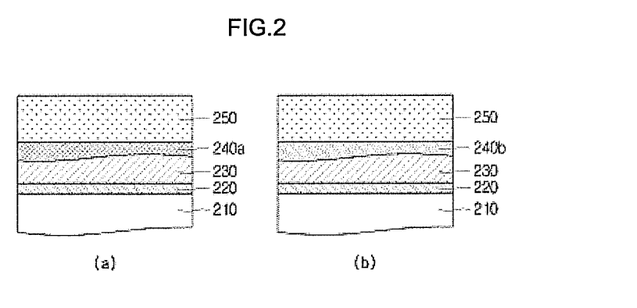
FIG. 2 is a sectional view illustrating a process of forming a conductive support strongly boned in a growth direction by performing a wafer bonding process and an electroplating process before the laser lift-off process, according to the related art to prevent the damage and braking of the multilayered light emitting structure thin film.

FIG. 2 is a sectional view illustrating a process of forming a conductive support strongly boned in a growth direction by performing a wafer bonding process and an electroplating process before the laser lift-off process, according to the related art to prevent the damage and braking of the multilayered light emitting structure thin film.

In reference to FIG. 2(a), before separating the multilayered light emitting structure thin film 220 and 230 consisting of the III-V nitride based semiconductor thin films after irradiating a laser beam via a back side of a transparent sapphire substrate 210, a wafer bonding process is performed on a bonding layer 240a form a strongly bonded conductive support 250 in a safe structure. Also, in reference to FIG. 2(b), before separating the multilayered light emitting structure thin films 220 and 230 from the sapphire substrate 210, an electroplating process is performed on a seeding layer 240b to form a strongly bonded conductive support 250 in a safe structure.

Figure 3:
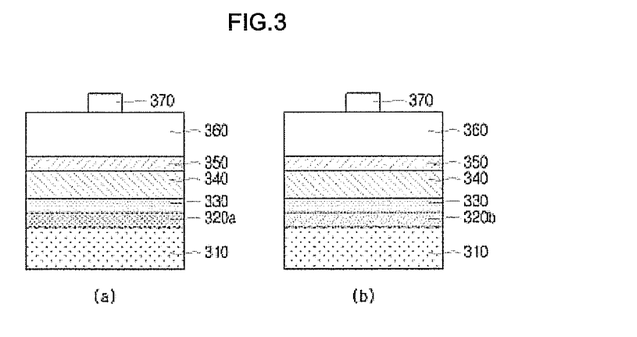
FIG. 3 is a sectional view illustrating a vertical-structure the III-V nitride based semiconductor light emitting device fabricated by using the conductive support strongly bonded in a safe structure with respect to the LLO process, according to the related art using the method of FIG. 2.

FIG. 3 is a sectional view illustrating a vertical-structure the III-V nitride based semiconductor light emitting device fabricated by using the conductive support strongly bonded in a safe structure with respect to the LLO process, according to the related art using the method of FIG. 2.

FIG. 3(a) is a sectional view illustrating a semiconductor light emitting device fabricated by using the method of forming the conductive support shown in FIG. 2(a). in reference to FIG. 3(a) illustrating the sectional view of the vertical light emitting device using the wafer bonding, the vertical light emitting device sequentially includes a conductive support 310 as a thermal and electrical insulator, a multilayered metal layer 330 having a bonding layer 320a and a p-type ohmic contact electrode 350, a p-type semiconductor clad layer 340, a light emitting active layer 350, n-type semiconductor clad layer 360, and a n-type ohmic contact layer 370. A semiconductor wafer having good thermal and electrical conductivity is used for the support 310 such as Si, Ge, SiGe and GaAs.

However, there is a big difference between the thermal expansion coefficient of the support 310 used in the vertical-structure light emitting device shown in FIG. 3(a) and that of the sapphire substrate having the multilayered light emitting structure thin films 340~360 growing thereon. Accordingly, when Si or other conductive support is bonded according to wafer bonding, there might be wafer warpage and many micro-cracks generated in the multilayered light emitting structure thin film. That conventional light emitting structure has a disadvantage of difficulties in performing the processes and another disadvantage of a low production yield generated by the low performance thereof.

Meanwhile, FIG. 3(b) is a sectional view illustrating a semiconductor light emitting device fabricated according to the method of forming the conductive support shown in FIG. 2(b). In reference to FIG. 3(b) showing the sectional view of the vertical-structure light emitting device using the electroplating, the vertical-structure light emitting device fabricated by using the laser lift-off process and the electroplating process has the same structure, except a seeding layer 320b instead of the bonding layer 320a shown in FIG. 3(a). In this instance, the support 310 is a metallic thick film formed by the electroplating. A single metal such as Cu, Ni, W, Au and MO or alloy of those metals having good thermal electric conductivity may be used for the metallic thick film.

The support 310 provided in the light emitting device having the structure mentioned above shown in FIG. 3(b) is the metallic or alloyed thick film fabricated by the electroplating. Accordingly, the support 310 is more related to the big thermal expansion coefficient than the sapphire growth substrate, only to generate many problems of burr, wafer warpage and braking in the chip fabrication processes including mechanical sawing and laser scribing.

As a result, there are demands for a heat sink used in a vertical-structure semiconductor light emitting device that can solve the disadvantages of wafer warpage and braking, micro-crack generation, limitation on post-processes including the annealing and the chip fabrication and a low production yield, when fabricating the vertical-structure III-V nitride based semiconductor light emitting device by using the sapphire substrate separation process.

DISCLOSURE

Technical Problem

An object of the invention is to provide a good quality vertical-structure semiconductor light emitting device including a high performance heat sink support configured of a metallic thick film or metallic foil, without micro-cracks.

Another object of the invention is to provide a vertical-structure semiconductor light emitting device including a high performance heat sink, using a support substrate for semiconductor light emitting device fabrication.

Technical Solution

In an aspect of the invention provided to achieve the first object, a vertical-structure semiconductor light emitting device includes a light emitting structure comprising an ohmic contact electrode, a conductive thin film and a first metallic thick film, the light emitting structure consisting of III-V nitride based semiconductors; and a second metallic thick film bonded by a bonding layer formed under the first metallic thick film.

A first ohmic contact electrode may be formed on the light emitting structure and a second ohmic contact electrode, an insulative thin film, a first conductive thin film, a second conductive thin film and a first metallic thick film may be formed under the light emitting structure sequentially.

A thin passivation film may be formed on a side of the light emitting structure.

The first metallic thick film may be formed of metal, alloy or solid solution including at least one selected from a group consisting of Au, Cu, Ni, Ag, Mo, Al, Nb, W, Ti, Cr, Ta, Al, Pd, Pt and Si.

The first metallic thick film may have a thickness of 0.1~999 μm.

The second metallic thick film may be formed of metal, alloy or solid solution including at least one selected from a group consisting of Au, Cu, Ni, Ag, Mo, Al, Nb, W, Ti, Cr, Ta, Al, Pd, Pt and Si.

The second metallic thick film may have a thickness of 0.1~999 μm.

A heat sink support configured of the first metallic thick film, the bonding layer and the second metallic thick film may include an auxiliary support.

The auxiliary support may be formed of a single-crystalline or polycrystalline wafer selected from Si, Ge, SiGe, ZnO, GaN, AlGaN, GaAs, AlN and BeO, a metallic foil selected from Mo, Cu, Ni, Nb, Ta, Ti, Au, Ag, Cr, NiCr, CuW, CuMo and NiW or a laminate structure selected from Cu/Mo/Cu, Cu/W/Cu, Ni/Mo/Ni, Cu/Ti/Cu, Cu/AlN/Cu, Cu/Al$_2$O$_3$/Cu, Cu/GaAs/Cu and Cu/Si/Cu.

In a further aspect of the invention, a vertical-structure semiconductor light emitting device comprising: a light emitting structure comprising an ohmic contact electrode, a conductive thin film and a first metallic thick film, the light emitting structure consisting of III-V nitride based semiconductors; and a metallic foil bonded by a bonding layer formed under the light emitting structure.

A first ohmic contact electrode may be formed on the light emitting structure and a second ohmic contact electrode, an insulative thin film, a first conductive thin film and a second conductive thin film may be formed under the light emitting structure sequentially.

A thin passivation film may be formed on a side of the light emitting structure.

The metallic foil may have a thickness of 0.1~999 μm.

The metallic foil may be a plate-shaped metal, alloy or solid solution comprising at least one selected from a group consisting of Cu, Al, Ni, Nb, W, Mo, Ta, Ti, Au, Ag, Pd, Pt, Cr, Fe, V, Si and Ge.

A heat sink support configured of the metallic foil may include an auxiliary support.

The auxiliary support may be formed of a single-crystalline or polycrystalline wafer selected from Si, Ge, SiGe, ZnO, GaN, AlGaN, GaAs, AlN and BeO, a metallic foil selected from Mo, Cu, Ni, Nb, Ta, Ti, Au, Ag, Cr, NiCr, CuW, CuMo and NiW or a laminate structure selected from Cu/Mo/Cu, Cu/W/Cu, Ni/Mo/Ni, Cu/Ti/Cu, Cu/AlN/Cu, Cu/Al$_2$O$_3$/Cu, Cu/GaAs/Cu and Cu/Si/Cu.

The bonding layer may be formed of a soldering or brazing alloy comprising at least one selected from a group consisting of Ga, Bi, In, Sn, Pb, Au, Al, Ag, Cu, Ni, Pd, Si, Ge and Zn.

The first ohmic contact electrode may be formed of a predetermined material comprising at least one selected from a group consisting of Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare-earth metal, metallic silicide, semiconducting silicide, CNTNs, transparent conductive oxide and transparent conductive nitride.

The second ohmic contact electrode may be formed of a predetermined material comprising at least one selected from a group consisting of Al, Rh, Pt, Au, Cu, Ni, Pd, metallic silicide, Ag-based alloy, Al-based alloy, Rh-based alloy, CNTNs, transparent conducting oxide and transparent conducting nitride.

The insulative thin film may be formed of transparent oxide, transparent nitride or transparent fluoride.

The insulative thin film is formed in an omni-directional reflector (ODR) and distributed Bragg reflector (DBR) structure.

The first conductive thin film or the second conductive thin film may be formed of a predetermined material comprising at least one selected from a group consisting of Au, Al, Ag, Rh, Ru, Ir, Ti, V, Pd, W, Cr, Ni, Cu, Mo, Ta, Nb, Pt, NiCr, TiW, CuW, TiN, CrN and TiWN.

In a further aspect of the invention, a method for fabricating a vertical-structure semiconductor light emitting device includes steps of (a) preparing a first wafer having a multilayered light emitting structure thin film consisting of III-V nitride based semiconductors, a second ohmic contact electrode, a first metallic thick film and a first bonding layer sequentially formed on a sapphire substrate; (b) preparing a support substrate for fabricating a semiconductor light emitting device as a second wafer having a sacrificial layer, a second metallic thick film and a second bonding layer sequentially formed on a selected supporting substrate; (c) bonding the first and second wafers with each other to bond the first bonding layer and the second bonding layer with each other; (d) separating a sapphire substrate of the first wafer from a result of the (c) step in Laser Lift-Off; (e) isolating a multilayered light emitting structure thin film exposed in the (d) step; (f) forming a plurality of first ohmic contact electrodes and thin side passivation films on surfaces of the multilayered light emitting structure isolated in the (e) step; (g) separating a selected supporting substrate, when a selected supporting substrate of the second wafer is an electrical insulator; and (h) fabricating a single chip by vertically cutting a result of the (f) step, when the selected supporting substreat is an conductor, and vertically cutting a result of the (g) step.

The multilayered light emitting structure thin film of the (a) step may include an n-type semiconductor cladding layer, a light emitting active layer and a p-type semiconductor cladding layer, and each of the layers may be a single crystalline having a compositional formula: In$_x$(Ga$_y$Al1−y)N(0≤x≤1, 0≤y≤1, x+y>0).

The (a) step may include steps of (a1) forming a second ohmic contact electrode on the multilayered light emitting structure thin film; (a2) forming an insulative thin film on the multilayered light emitting structure thin film and the second ohmic contact electrode; (a3) forming a first conductive thin film on the second ohmic contact electrode; (a4) forming a second conductive thin film on the insulative thin film and the second ohmic contact electrode; (a5) forming the first metallic thick film on the second conductive thin film; and (a6) forming a 1-1 bonding layer on the first metallic thick film.

The second conductive thin film may include an adhesion-enhancing layer and a diffusion barrier layer and further comprises a seeding layer when the first metallic thick film is formed by electroplating or electroless-plating.

The (b) step may form the second bonding layer after forming a diffusion barrier layer or an adhesion-enhancing layer on the second metallic thick film.

The sacrificial layer of the (b) step may be formed according to e-beam evaporation or thermal evaporation, MOCVD, sputtering or PLD (Pulsed Laser Deposition).

The first metallic thick film or the second metallic thick film may be formed by electroplating or electroless-plating.

The (c) step may be performed at 100° C.~100° C. under 1~200 MPa by thermal compression bonding.

The (b) step may perform chemo-mechanical polishing or wet etching after the Laser Lift-Off.

The (a) step may separate the selected supporting substrate by using the Laser Lift-Off or by eliminating the sacrificial layer through chemical etching.

The (g) step may be performed after a temporary support substrate is bonded on a surface of the first wafer by an organic or inorganic bonding material.

After the (g) step, an auxiliary support may be formed in a region where the selected supporting substrate and the sacrificial layer are eliminated.

The auxiliary support may be formed of a single-crystalline or polycrystalline wafer selected from Si, Ge, SiGe, ZnO, GaN, AlGaN, GaAs, AlN and BeO, a metallic foil selected from Mo, Cu, Ni, Nb, Ta, Ti, Au, Ag, Cr, NiCr, CuW, CuMo and NiW or a laminate structure selected from Cu/Mo/Cu, Cu/W/Cu, Ni/Mo/Ni, Cu/Ti/Cu, Cu/AlN/Cu, Cu/Al$_2$O$_3$/Cu, Cu/GaAs/Cu and Cu/Si/Cu.

Before forming the second ohmic contact electrode in the (a) step and forming the first ohmic contact electrode in the (f) step, an unevenness or patterning may be performed to provide a light extraction structure layer or an aluminum film nano-grid polarizer may be further provided.

In a still further aspect of the invention, a method for fabricating a vertical-structure semiconductor light emitting device includes steps of (a) preparing a first wafer having a multilayered light emitting structure thin film consisting of III-V nitride based semiconductors, a second ohmic contact electrode, a first metallic thick film and a first bonding layer sequentially formed on a sapphire substrate; (b) preparing a metal foil having a first' bonding layer thereon and a second bonding layer there under; (c) preparing a support substrate for fabricating a semiconductor light emitting device as a second wafer having a sacrificial layer and a second bonding layer formed on a selected supporting substrate; (d) bonding the first wafer, the metallic foil and the second wafer with each other to bond the first bonding layer with the first' bonding layer and the second bonding layer with the second' bonding layer; (e) separating a sapphire substrate of the first wafer from a result of the (d) step via Laser Lift-Off; (f) isolating a multilayered light emitting structure thin film exposed by the (e) step; (g) forming a plurality of first ohmic contact electrodes on a surface of each multilayered light emitting structure exposed by the (f) step and forming a thin side passivation thin film; (h) separating the selected supporting substrate, when the selected supporting substrate of the second wafer is an electric insulator; and (i) fabricating a single chip by vertically cutting a result of the (g) step, when the selected supporting substrate is an conductor, and vertically cutting a result of the (h) step.

The (h) step may be performed after a temporary support substrate is bonded on a surface of the first wafer by an organic or inorganic bonding material.

After the (h) step, an auxiliary support may be formed in a region where the selected supporting substrate and the sacrificial layer are eliminated.

The auxiliary support may be formed of a single-crystalline or polycrystalline wafer selected from Si, Ge, SiGe, ZnO, GaN, AlGaN, GaAs, AlN and BeO, a metallic foil selected from Mo, Cu, Ni, Nb, Ta, Ti, Au, Ag, Cr, NiCr, CuW, CuMo and NiW or a laminate structure selected from Cu/Mo/Cu, Cu/W/Cu, Ni/Mo/Ni, Cu/Ti/Cu, Cu/AlN/Cu, Cu/Al$_2$O$_3$/Cu, Cu/GaAs/Cu and Cu/Si/Cu.

BEST MODE

Hereinafter, a vertical-structure semiconductor light emitting device and a method of fabricating a vertical-structure semiconductor light emitting device according to embodiments will be described with reference to the annexed drawings.

A support substrate for fabricating a vertical-structure light emitting device that will be used for fabricating a vertical-structure semiconductor light emitting device includes a selected supporting substrate formed of a predetermined material having 5 ppm or less of thermal expansion coefficient difference with respect to a sapphire substrate where a multilayered light emitting structure thin film consisting of III-V nitride based semiconductor thin films growing thereon; a sacrificial layer formed on the selected supporting substrate; a metallic thick film formed on the sacrificial layer; and a bonding layer formed on the metallic thick film, formed of a soldering or brazing alloy. The support substrate for fabricating the vertical-structure light emitting device may generate no wafer warpage in wafer bonding and prevent micro-cracks or braking by reducing stress applied to the multilayered light emitting structure thin film in Laser Lift-Off performed to separate the sapphire substrate. Also, the support substrate may minimize damage to the multilayered light emitting structure that is generated by a wafer bonding material.

In reference to FIG. 4(a), a support substrate 400 for fabricating a light emitting device includes a selected supporting substrate 410 a sacrificial layer 430, a metallic thick film 430 and a bonding layer 440.

The selected supporting substrate 410 is employed for mechanical shock absorption and support required to minimize damage to a separated multilayered light emitting structure thin film having a thickness of predetermined micrometers (μm), after separating a multilayered light emitting structure thin film from a transparent sapphire substrate as an initial growth substrate, where a multilayered light emitting structure thin film consisting of III-V nitride based semiconductor thin films is layered, in Laser Lift-Off or other processes.

The selected supporting substrate 410 may be formed of a selected material having 5 ppm or less of a thermal expansion coefficient difference with respect to the sapphire substrate. That is because safer warpage has to be minimized that might be generated by a thermal expansion coefficient difference between the sapphire substrate and the support substrate 400 after a wafer bonding performed to bond the support substrate 400 to the sapphire substrate before separate the multilayered light emitting structure thin film from the sapphire substrate.

Accordingly, for the selected supporting substrate 410 may be used single-crystalline polycrystalline or amorphous substrate wafer as an electric insulating material having 5 ppm or less of a thermal expansion coefficient difference with the initial growth substrate such as sapphire ($Al_2O_3$), aluminum nitride (AlN), MgO, AlSiC, BN, BeO, $TiO_2$ or $SiO_2$, or single-crystalline, polycrystalline or non-crystalline or amorphous substrate wafer as a conductive material having good thermal conductivity such as Si, Ge, SiGe, ZnO, GaN, AlGaN or GaAs, or a metallic foil formed of single metal or alloy of these metals such as Mo, Cu, Ni, Nb, Ta, Ti, Au, Ag, Cr, NiCr, CuW, CuMo or NiW.

If the thickness of the selected supporting substrate 410 is mechanically insufficient, an auxiliary bonding layer formed of a metallic, alloyed or conductive adhesive is formed although not shown in the drawings. Required auxiliary supports are bonded to the metallic thick films as many as the required thickness, before a single chip fabrication process is performed.

In this instance, the auxiliary support may be formed of a single-crystalline or polycrystalline wafer having good thermal or electrical conductivity such as Si, Ge, SiGe, ZnO, GaN, AlGaN, GaAs, AlN or BeO, a metallic foil such as Mo, Cu, Ni, Nb, Ta, Ti, Au, Ag, Cr, NiCr, CuW, CuMo or NiW or a laminate structure such as Cu/Mo/Cu, Cu/W/Cu, Ni/Mo/Ni, Cu/Ti/Cu, Cu/AlN/Cu, Cu/$Al_2O_3$/Cu, Cu/GaAs/Cu or Cu/Si/Cu.

The sacrificial layer 420 is a material layer required to separately eliminate the selected supporting substrate 410 from the finally fabricated vertical-structure light emitting device. The sacrificial layer 420 may be a single-crystalline, polycrystalline or amorphous compound combined with nitrogen or oxygen. When eliminating the selected supporting substrate 410 in Laser Lift-Off, such the sacrificial layer 420 may be formed of GnA, InGaN, ZnO, GaZnO, MgZnO, InZnO, InN, $In_2O_3$, $GaInO_3$, $MgInO_4$, $CuInO_2$, ZnInO, ITO, $SfO_2$, $Si_3N_4$, $SiO_2$, BeMgO, TiN, VN, CrN or TaN.

The sacrificial layer 420 enables the selected supporting substrate 410 to be separately eliminated in a chemical etch process. In this instance, the sacrificial layer 420 may be formed of metal, alloy, solid solution, oxide, nitride or thermophilic organic material.

When the sacrificial layer 420 is formed of a heat resistant adhesive material, the heat resistant adhesive material may at least one selected from a group consisting of a heat resistant adhesive, heat resistant adhesive tape, silicon adhesive and polyvinyl butyral resin.

When the sacrificial layer 420 is a Spin on Glass (SOG) thin film, the sacrificial layer 420 may include silicate or xyphenoxy. When it is a Spin On Dielectrics (SOD) thin film, the sacrificial layer 420 may include silicate, siloxane, methyl silsequioxane (MSQ), hydrogen silsequioxane (HSQ), MQS+HSQ, perhydrosilazane (TCPS) and polysilazane.

When it is formed of photoresist, the sacrificial layer 420 may include at least one selected from a group consisting of AZ base, SU-8 base, TLOR base, TDMR base and GXR base.

As a result, the compositional material of the sacrificial layer 420 may be selected appropriately according to the characteristics of the selected supporting substrate 410, the separation method of the selected supporting substrate and the structure of the vertical light emitting device desired to fabricate finally.

The metallic thick film 430 is employed to reduce stress thermally and mechanically generated in the process of fabricating the light emitting device, using the wafer bonding. Also, the metallic thick film 430 may be employed as an adhesion-enhancing layer to enhance the bonding between materials and a diffusion barrier layer to prevent material movement. Such the metallic thick film 430 may have a thickness of approximately 0.1~999 μm, preferably, 0.1~500 μm.

The metallic thick film 430 may be formed of metal, alloy or solid solution that includes at least one of Au, Cu, Ni, Ag, Mo, Al, Nb, W, Ti, Cr, Ta, Al, Pd and Si.

The metallic thick film 430 may be formed on the sacrificial layer 420 according to conventional physical vapor deposition (PVD) or chemical vapor deposition (CVD). It is preferable that the metallic thick film 430 is formed according to a plating method having electroplating and electroless-plating.

Figure 10:
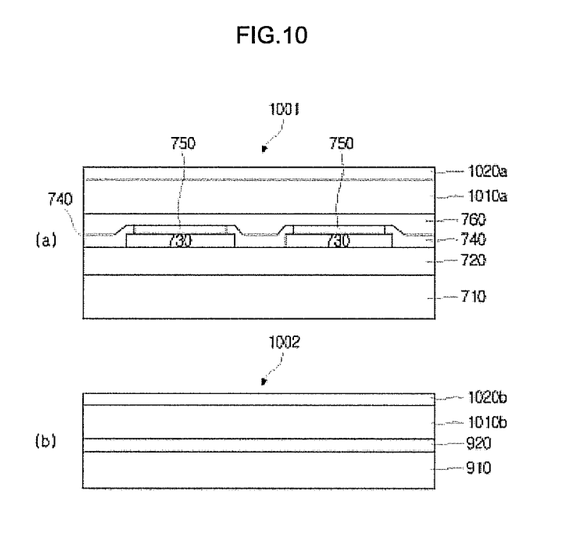

The bonding layer 440 is a material layer used in bonding a first wafer (1001, see FIG. 10) having a sapphire substrate and a second wafer (1002, see FIG. 10) that is the support substrate 400 according to the invention. Such the bonding layer 440 may be formed of soldering or brazing alloy having at least one of Ga, Bi, In, Sn, Pb, Au, Al, Ag, Cu, Ni, Pd, Si and Ge.

The support substrate 400 for fabricating the vertical semiconductor light emitting device according to the invention, with the structure mentioned above, may be fabricated by sequentially disposing the sacrificing layer 420, the metallic thick layer 430 and the bonding layer 440 on the selected supporting substrate 410.

FIGS. 4(a) to (f) are sectional views illustrating multilayered layers of a support substrate for fabricating a vertical-structure semiconductor light emitting device according to the invention.

FIGS. 4(a) and (b) are sectional views illustrating examples having no patterning. FIG. 4(d) illustrates a metallic thick film that is relatively thicker than a metallic thick film shown in FIG. 4(a).

FIGS. 4(b), (c) and (e) are sectional views illustrating examples that a predetermined one or more or all of the sacrificing layer 420, the metallic thick film 430 and the bonding layer 440 are patterned. FIGS. 4(b) and (e) are sectional views illustrating the bonding layer 440 and the metallic thick film 430 that are patterned. FIGS. 4(c) and (f) are sectional views illustrating that even the sacrificing layer 420 as well as the bonding layers 440 and the metallic thick film 430 are patterned. Although not shown in the drawings, such patterning may be performed even on a predetermined region of the selected supporting substrate 410. As shown in FIGS. (b), (c), (e) and (f), the patterning process of the bonding layer 440, the metallic thick film 430 and the sacrificing layer 420 may enable the elimination process of the selected supporting substrate 410 and the single-chip fabrication process to be performed smoothly, when the semiconductor light emitting device is fabricated layer.

First Embodiment of Vertical-Structure Semiconductor Light Emitting Device

Figure 5:
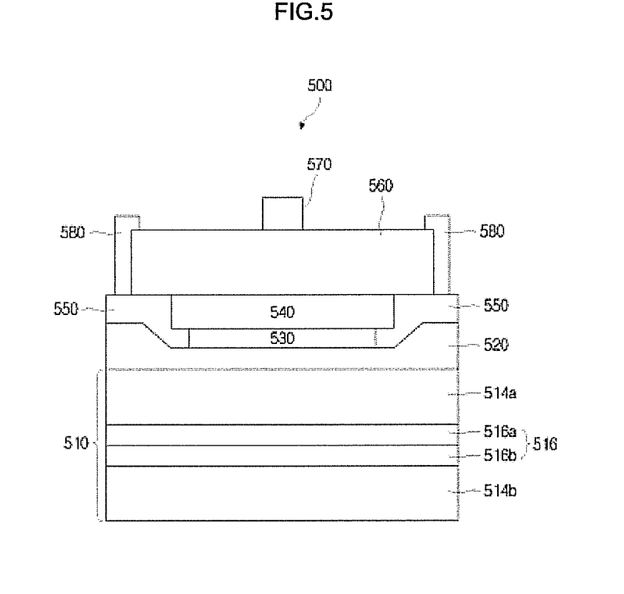
FIG. 5 is a sectional view illustrating a first embodiment of the vertical-structure semiconductor light emitting device including a support configured of two metallic thick films according to the invention.

FIG. 5 is a sectional view illustrating a first embodiment of the vertical-structure semiconductor light emitting device according to the invention.

In reference to FIG. 5, a vertical-structure semiconductor device 500 according to the first embodiment includes two metallic thick films 514a and 514b bonded by upper and lower bonding layers 516a and 516b. In this instance, a metallic thick film 514a is formed on a sapphire substrate having the multilayered light emitting structure thin film comprising of the III-V nitride based semiconductors layered thereon. The other metallic thick film 514b is formed on the support substrate 400 shown in FIG. 4. The bonding layers 516a and 516b and the two metallic thick films 514a and 514b may constitute a heat sink support 510.

As shown in FIG. 5, the vertical-structure semiconductor light emitting device includes a conductive multilayered film 520 and 530 formed on the first metallic thick film 514a, a second ohmic contact electrode 540, an insulative thin film 550, a multilayered light emitting structure thin film 560 comprising of III-V nitride based semiconductors, a first ohmic contact electrode 570 and a thin side passivation film 580.

The thin side passivation film 580 is mechanically connected with the insulative thin film 550. The thin side passivation film 580 partially protects a top surface and entirely protects lateral surfaces of the multilayered light emitting structure thin film 560.

The first and second metallic thick films 514a and 514b are employed as a support of the multilayered light emitting structure thin film 560, a current injection medium and a heat sinker. As mentioned above, the metallic thick films 514a and 514b are employed to reduce the thermal or mechanical stress generated in fabricating the semiconductor light emitting device through the wafer bonding process using the support substrate 400. such the metallic thick films 514a and 514b may have a predetermined thickness of 0.1~999 µm or less.

A bonding layer 516 positioned between the two metallic thick films 514a and 514b may be formed of a soldering or brazing alloy having at least one of Ga, Bi, In, Sn, Pb, Au, Al, Ag, Cu, Ni, Pd, Si and Ge.

The reflective second ohmic contact electrode 540 directly in contact with the multilayered light emitting structure thin film 560 comprising of the III-V nitride based semiconductors may be formed of a predetermined material including at least one of Al, Rh, Pt, Au, Cu, Ni, Pd, metallic silicide, Ag-based alloy, Al-based alloy, Rh-based alloy, CNTNs (carbon nanotube networks), transparent conducting oxide and transparent conducting nitride that are able to upwardly reflect a photon generated from the multilayered light emitting structure thin film 560.

The insulative thin film 550 is employed for an isolation process performed to form a single chip and it is formed of transparent oxide such as $SiO_2$, SiNx, AlN, ITO, $Al_2O_3$, MgF, $SnO_2$ or $ZnO_2$, transparent nitride or transparent fluoride. Furthermore, the insulative thin film 550 may have an omnidirectional reflector (ODR) structure and a distributed Bragg reflector (DBR) structure.

The second conductive thin film 520 includes an adhesion-enhancing layer to enhance bonding between materials with the first conductive thin film 530 formed on the second ohmic contact electrode 540, a diffusion barrier layer to prevent material movement and a seeding layer required in forming a conductive thick layer in electroplating. Such the second conductive thin film 520 may be formed of a predetermined material including at least one of Au, Al, Ag, Rh, Ru, Ir, Ti, V, Pd, W, Cr, Ni, Cu, Mo, Ta, Nb, Pt, NiCr, TiW, CuW, TiN, CrN and TiWN.

The thin side passivation film 580 configured to protect lateral surfaces of the multilayered light emitting structure thin film 560 is mechanically connected with the insulative thin film 550, in contact. The thin side passivation film 580 is formed of at least one of $Si_3N_4$, $SiO_2$ or various insulative materials.

The first ohmic contact electrode 570 formed on the multilayered light emitting structure thin film 560 may be formed of a predetermined material including at least one of Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare-earth metal and alloy, metallic silicide, semiconducting silicide, CNTNs, transparent conductive oxide and transparent conductive nitride that are able to form ohmic contact having a low contact resistance. Especially, surface treatment such as annealing, oxidation or nitridation may be performed to form the ohmic contact with a low contact resistance.

The multilayered light emitting structure thin film 560 is a light emitting device structure configured to generate a photon in injecting a current via the first ohmic contact electrode 570 and the second ohmic contact electrode 540. Basically, the multilayered light emitting structure thin film 560 includes a b-type semiconductor cladding layer, a light emitting active layer, a p-type semiconductor cladding layer. Each of the layers is a single crystalline having a compositional formula: $In_x(Ga_yAl_{1-y})N$ x+y>0). In reference to FIG. 5, when the first ohmic contact electrode 570 is an n-type ohmic contact electrode and the second ohmic contact electrode 540 is a p-type ohmic contact electrode, the n-type semiconductor cladding layer may be positioned under the first ohmic contact electrode 570 and the p-type semiconductor cladding layer may be positioned on the second ohmic contact electrode 540.

To emit photons generated in the light emitting device structure as many as possible, an unevenness or pattering process is performed or an aluminum film nano-grid polarizer may be provided on a surface of the multilayered light emitting structure thin film 560 in contact with the first ohmic contact electrode 570 or the second ohmic contact electrode 540 to form a light extraction structure layer is provided on the first ohmic contact electrode 570 or the second ohmic contact electrode 540.

Although not shown in the drawings, the diffusion barrier layer configured to prevent material movement with the adhesion-enhancing layer configured to enhance the bonding between materials may be further formed, before layering the bonding layer 516 between a back surface 516a of the first metallic thick film 514a and a top surface 516b of the second metallic thick film 514b.

Second Embodiment of Vertical-Structure Semiconductor Light Emitting Device

Figure 6:
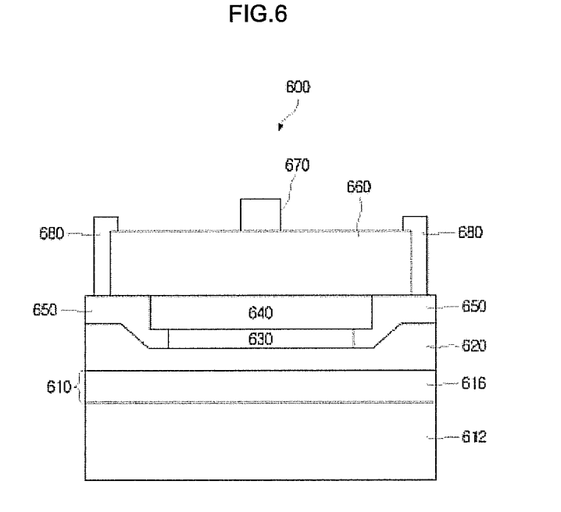
FIG. 6 is a sectional view illustrating a second embodiment of the vertical-structure semiconductor light emitting device including only a metallic foil without a metallic thick film according to the invention.

FIG. 6 is a sectional view illustrating a second embodiment of the vertical-structure semiconductor light emitting device according to the invention.

In reference to FIG. 6, s vertical-structure semiconductor light emitting device 600 includes a metallic foil 612 bonded by a bonding layer 616. The metallic foil 612 comprising of a heat sink support 610 may mechanically and securely support a multilayered light emitting structure thin film 660 and also it may be a current injection medium in driving the semiconductor light emitting device as well as a heat sinker to emit the heat generated from the semiconductor device. Considering the roles, the metallic foil 612 may be formed of rolling metal, alloy or solid solution that has electrical and thermal conductivity, with a thickness of 0.1~999 µm or less and it may include at least one of Cu, Al, Ni, Nb, W, Mo, Ta, Ti, Au, Ag, Pd, Pt, Cr, Fe, V, Si and Ge.

As shown in FIG. 6, the vertical-structure semiconductor light emitting device includes the metallic foil 612 provided under the light emitting structure configured of conductive multilayered films 620 and 630 formed on a top thereof, a second ohmic contact electrode 640, an insulative thin film 650, a multilayered light emitting structure thin film 660 comprising of III-V nitride based semiconductors.

Method for Fabricating First Embodiment of Vertical-Structure Semiconductor Light Emitting Device:

FIGS. 7 to 17 are sectional views illustrating each of steps comprising of a method for fabricating the vertical-structure semiconductor light emitting device shown in FIG. 6 and each of component parts. In reference to FIGS. 7 to 17, the method for fabricating the vertical-structure semiconductor device will be described.

The method for fabricating the vertical-structure semiconductor light emitting device includes steps of preparing a first wafer; preparing a support substrate for fabricating a semiconductor light emitting device as a second wafer; bonding the first and second wafers with each other; separating a sapphire substrate of the first wafer; isolating a multilayered light emitting structure thin film, a post-first wafer; separating a selected supporting substrate of the second wafer; and fabricating a single chip.

In the first wafer preparing step, the multilayered light emitting structure thin film comprising of the III-V nitride based semiconductors and the other ohmic contact electrodes are formed on the sapphire substrate. The first wafer 1001 having the first metallic thick film 1010a and the first bonding layer 1020a1 formed thereon is prepared after that (FIG. 10(a)).

Figure 7:
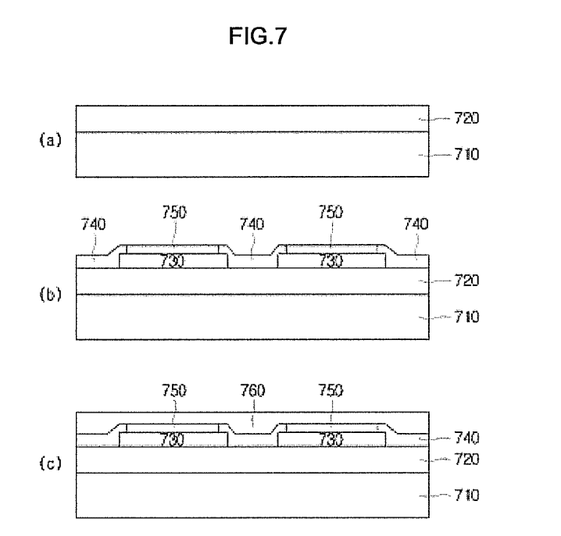
FIGS. 7 to 17 are sectional views illustrating each of steps consisting of a method for fabricating the vertical-structure semiconductor light emitting device shown in FIG. 6 and each of component parts.

FIG. 7 illustrates the step of preparing the first wafer 1001. In reference to FIG. 7, the multilayered light emitting structure thin film 720 is layered on the sapphire substrate 710 (FIG. 7(a)). After that, the second ohmic contact electrode 730, the insulative thin film 740 and the first conductive thin film 750 are sequentially layered on the sapphire substrate (FIG. 7(b)) and the second conductive thin film 760 is then formed (FIG. 7(c)).

To fabricate the multilayered light emitting thin film, basically required layers, in other words, a low and high temperature buffering layer, a n-type semiconductor cladding layer, a light emitting active layer and a p-type semiconductor cladding layer are sequentially growing and layered on the sapphire substrate 710, using MOCVD and MBE systems that are the most conventional III-V nitride based semiconductor thin film growth equipments.

For example, the III-V nitride based semiconductor thin films 720 may be layered on the transparent sapphire substrate 710, using metal organic chemical vapor deposition (MOCVD), liquid phase epitaxy, hydride vapor phase epitaxy, molecular beam epitaxy, metal organic vapor phase epitaxy (MOVPE) equipments. In the layering structure may be sequentially layered on the sapphire substrate a low-temperature buffering layer directly growing at 600° C. or less and a high-temperature buffering layer configured of III-V nitride based semiconductors having silicon (Si) doped thereon, a Si-doped semiconductor cladding layer, a semiconductor light emitting active layer and a Mg-doped semiconductor cladding layer.

Each of the low and high temperature buffering layers, the n-type semiconductor cladding layer, the semiconductor light emitting active layer and the p-type semiconductor cladding layer may have a compositional formula: $In_x(Ga_yAl_{1-y})N$ ($0 \le x \le 1$, $1 \le y \le 1$, $x+y>0$). The light emitting active layer may have a single quantum well (SQW) structure configured of a barrier layer having Inx(GayAl1−y)N and a well layer having Inx(GayAl1−y)N or a multi quantum well (MQW) structure. A compositional ratio of In, Ga and Al of the light emitting active layer is adjusted to fabricate a light emitting device from a long wavelength having an InN(~0.7 eV) band gap to a short wavelength having an AlN(~6.2 eV) band gap freely. A band gap of the well layer is lower than a band gap of the barrier layer to collect an electrons and a hole in a well. Accordingly, internal quantum efficiency may be enhanced. Especially, Si or Mg may be doped on at least one of the well and barrier layers to enhance the light emitting characteristic and to lower a forward driving voltage.

In this instance, on a surface of the n-type semiconductor cladding may be formed a first ohmic contact electrode (1410, see FIG. 14) that is an n-type ohmic contact electrode after separating the sapphire substrate which will be described later. On a surface of the p-type semiconductor cladding layer are formed a second ohmic contact electrode 730 as a p-type ohmic contact electrode and an inslative thin film 740. Before forming the second ohmic contact electrode 730 and the insulative thin film 740 on the p-type semiconductor cladding layer that is a top layer of the multilayered light emitting structure thin film 720, an unevenness or patterning may be performed to provide a light extraction structure layer or an aluminum film nano-grid polarizer may be further provided.

As shown in FIG. 7(b), the first conductive thin film 750 is formed on a predetermined region of the second ohmic contact electrode 730. On the insulative thin film 740 and the first conductive thin film 750 may be the second conductive thin film 760 including an adhesion-enhancing layer to enhance bonding between materials, a diffusion barrier layer to prevent material movement or a seeding layer provided when a metallic thick film is formed by electroplating (FIG. 7(c)).

Although not shown in FIG. 7, patterning having a plurality of rectangles and squares aligned regularly to ease the single chip fabrication and dry etching are used to form trench deeper than the light emitting active layer of the multilayered light emitting structure thin film 720.

The reflective second ohmic contact electrode 730 disposed on the multilayered light emitting structure thin film 720 may be formed of a predetermined material including at least one of Ag, Al, Rh, Pt, Au, Cu, Ni, Pd, metallic silicide, Ag-based alloy, Al-based alloy, Rh-based alloy, CNTNs, transparent conductive oxide and transparent conductive nitride. The insulative thin film 740 may be formed of transparent oxide, transparent nitride or opaque fluoride such as $SiO_2$, SiNx, AlN, ITO, $Al_2O_3$, MgF, $SnO_2$ and $ZnO_2$. In an mechanical aspect, the insulative thin film 740 may have the ODR and DBR structure.

The first conductive thin film 750 and the second conductive thin film 760 may be formed of a predetermined material including at least one of Au, Al, Ag, Rh, Ru, Ir, Ti, V, Pd, W, Cr, Ni, Cu, Mo, Ta, Nb, Pt, NiCr, TiW, CuW, TiN, CrN and TiWN.

As a result, the first wafer preparing step may be performed in a following order.

First of all, the second ohmic contact electrodes are formed on the multilayered light emitting structure thin film 720 growing and disposed on the sapphire substrate 710. after that, the insulative thin film 740 is formed on the multilayered light emitting structure thin film 720 and the second ohmic contact electrodes 730 and the plurality of the first conductive thin films 750 are formed on the plurality of the second ohmic contact electrode 730 according to partial etching and deposition performed on the insulative thin film 740. Hence, the diffusion barrier layer and the adhesion-enhancing layer are provided on the insulative thin film 740 and the plurality of the second ohmic contact electrodes 730. When the first metallic thick film 1010a is formed by electroplating or electroless-plating, the second conductive thin film 760 having the seeding layer formed thereon is formed and the first metallic thick film 1010a and the first bonding layer 1020a are formed on the second conductive thin film 760.

Figure 4:
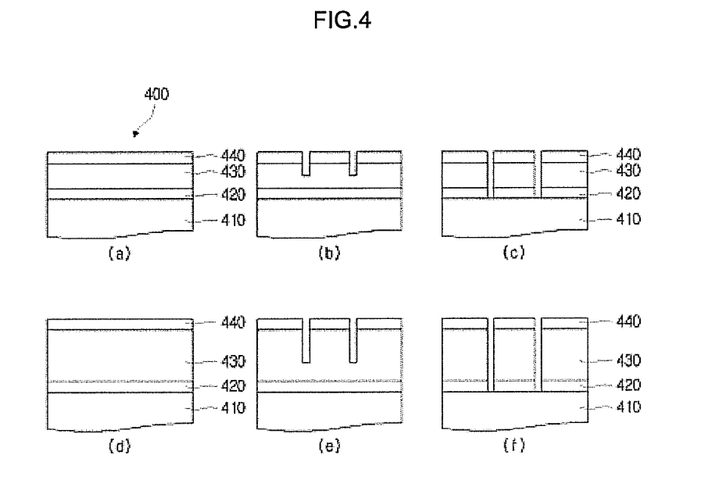
FIGS. 4(a) to (f) are sectional views illustrating multilayered layers of a support substrate for fabricating a vertical-structure semiconductor light emitting device according to the invention.

In the second wafer preparing step is prepared a second wafer 1002 (FIG. 10(b)) having the same structure of the support substrate 400 shown in FIG. 4 that has a sacrificial layer 920, a second metallic thick film 1010b and a second bonding layer 1020b sequentially formed on a selected supporting substrate 910.

The sacrificial layer 920, the metallic thick film 1010b and the second bonding layer 1020b may be sequentially formed on the selected supporting substrate 910 according to physical vapor deposition, chemical vapor deposition or electrochemical vapor deposition such as electroplating.

Especially, the sacrificing layer 920 may be formed according to e-beam evaporation, thermal evaporation MOCVD, sputtering or pulsed laser deposition (PLD). The second metallic thick film 1010b and the first metallic thick film 1010a of the first wafer may be formed according to electroplating or electroless-plating.

In addition, the second bonding layer 1020b may be formed after a diffusion barrier layer or adhesion-enhancing layer is formed on the second metallic thick film 1010b.

Figure 11:
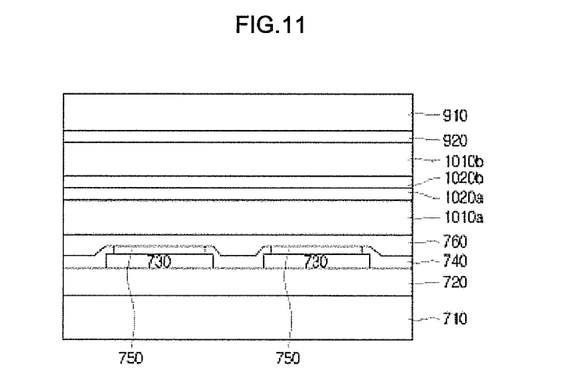

In the bonding step, the first bonding layer 1020a of the first wafer 1001 is wafer-to-wafer-bonded with the second bonding layer 1020b of the second wafer 1002 (see, FIG. 11). For that, each of the bonding layers may be formed of soldering or brazing alloy including at least one of Ga, Bi, In, Sn, Pb, Au, Al, Ag, Cu, Ni, Pd, Si and Ge. Prior to the bonding layer forming, an adhesion-enhancing layer configured to enhance bonding between materials and a diffusion barrier layer configured to prevent material movement may be provided.

In the bonding step, the first metallic thick film 1010a and the second metallic thick film 1010b perform various functions including thermal and mechanical stress reduction. Such the metallic thick films may be formed of metal, alloy or solid solution that includes at least one of Au, Cu, Ni, Ag, Mo, Al, Nb, W, Ti, Cr, Ta, Al, Pd, Pt and Si, with high electrical and thermal conductivity, and they may be formed according to conventional chemical or physical vapor deposition (CVD/PVD), preferably, electroplating or electroless-plating.

The bonding step may be performed according to thermal-expansion bonding and it may be performed higher than 100° C. and lower than 600° C. at 1~1200 Mpa.

Once the bonding is completed, a result having a vertical-structure is generated from the sapphire substrate 710 of the first wafer 1001 to the selected supporting substrate 910 of the second wafer 1002 as shown in FIG. 11.

Figure 12:
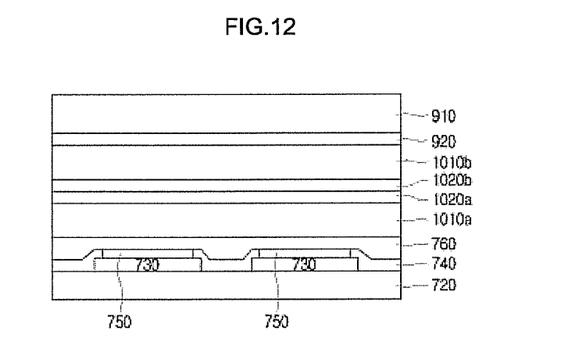

In the sapphire substrate separating step, the sapphire substrate 710 of the first wafer is separated from the result bonded in the bonding step (see FIG. 12).

The sapphire substrate 710 may be separated according to the conventional laser lift-off technique. When a laser beam that is a strong energy source is irradiated via a back side of the sapphire substrate, laser absorption is generated at an interface between the sapphire substrate 710 and the multilayered light emitting structure thin film 720 comprising of the III-V nitride based semiconductor single-crystalline. Accordingly, the sapphire substrate 710 is separately eliminated by thermo chemical decomposition of gallium nitride positioned on the interface.

After separating the sapphire substrate 710, there may be provided a surface treating step performed on a surface of the multilayered light emitting structure thin film 720 that is exposed to air at 30° C. to 200° C., using at least one of $H_2SO_4$, HCl, KOH and BOE. In addition, mechanical-chemical polishing and continuous wet etching may be performed to eliminate the sapphire substrate 710 completely. In the wet etching of the sapphire substrate, solution using one or combination of $H_2SO_4$, $CrO_3$, $H_3PO_4$), Ga, Mg, In and Al may be used as etching solution. The temperature of the wet etching solution may be 200° C. or higher.

Once the sapphire substrate 710 is completely separated, a result having a vertical-structure is formed from the multilayered light emitting structure thin film 720 of the first wafer 1001 to the selected supporting substrate 910 of the second wafer 1002 as shown in FIG. 12.

In the multilayered light emitting structure isolation step, the multilayered light emitting structure thin film 720 exposed to a surface of the first wafer after the sapphire substrate 710 is separated is isolated (see, FIG. 13), to fabricate a plurality of light emitting devices.

Figure 13:
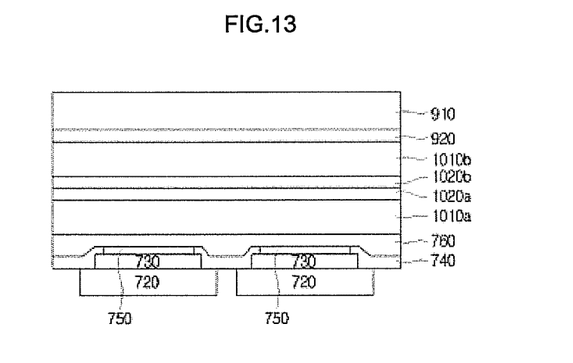

FIG. 13 is a sectional view illustrating the isolation step performed on the exposed multilayered light emitting structure thin film 720 by a single direction and shape, after the sapphire substrate is separated.

In reference to FIG. 13, wet or dry etching is performed on the multilayered light emitting structure thin film 720 in the isolation step until at least the insulative thin film 740 is exposed to air.

Figure 14:
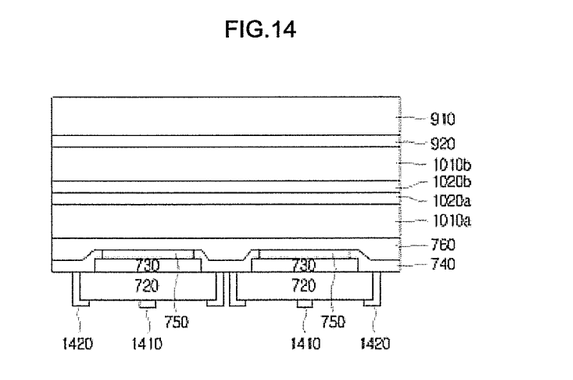

In the post-first wafer step, the first ohmic contact electrode 1410 is formed on each of the isolated multilayered light emitting structure thin films 720 and the passivation thin film 1420 is formed on lateral surfaces of the multilayered light emitting structure thin film 720.

FIG. 14 is a sectional view illustrating the thin side passivation film 1420 and the first ohmic contact electrode 1410 formed with respect to each of the multilayered light emitting structure thin film 720.

In reference to FIG. 14, a post-process is performed in the post-first wafer step such as wafer cleaning, a process of forming the thin side passivation film 1420 and the first ohmic contact electrode 1410 and annealing.

Specifically, in the post-first wafer, the first ohmic contact electrode 1410 that is thermally safe via the first ohmic contact electrode deposition and annealing is formed on the buffer layer that is the multilayered light emitting structure thin film 720 or the n-type semiconductor cladding layer. Using at least one of $Si_3N_4$, $SiO_2$ and various insulative materials, the thin passivation film 1420 is formed to electrically protect a surface or side of the III-V nitride based semiconductor device.

The first ohmic contact electrode 1410 may be formed of a predetermined material including at least one of Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare-earth metal and alloy, metallic silicide, semiconducting silicide, CNTNs, transparent conductive oxide and transparent conductive nitride.

Figure 15:
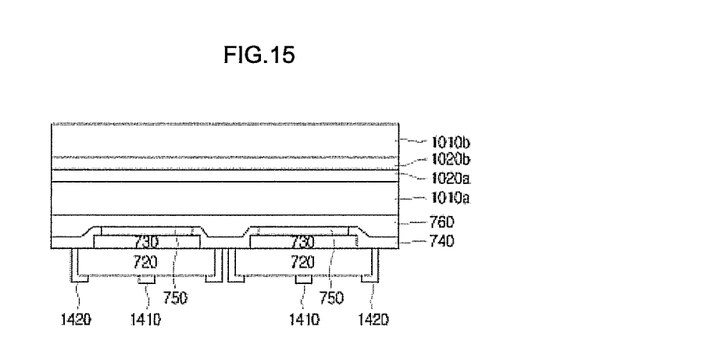

When the selected supporting substrate is an electric insulator, a selected supporting substrate separating step is provided. In the selected supporting substrate separating step, the selected supporting substrate 910 is separated from the second wafer 1002 according to laser lift-off or chemical etching.

FIG. 15 is a sectional view illustrating a result after separating the selected supporting substrate 910 from the second wafer 1002.

When the selected supporting substrate 910 is optically transparent, a laser beam having a proper absorption wavelength range is irradiated via a back side of the transparent selected supporting substrate 910 based on a material used for the sacrificial layer to separate the selected supporting substrate 910. In this instance, similar to the separation of the sapphire substrate mentioned above, strong laser absorption is generated at an interface between the sacrificial layer 920 and the transparent selected supporting substrate 910 and the selected supporting substrate 910 is then separated by thermochemical decomposition or mechanical shock of the material of the sacrificial layer 920 positioned on the interface. After that, there may be provided a step of treating remnants of the sacrificial layer 920 exposed to the air at 30° C. to 200° C., using $H_2SO_4$, HCl, KOH, BOE, various acid, base, salt solution.

Rather than the laser lift-off process, the selected supporting substrate 910 may be completely eliminated via mechanical-chemical polishing and continuous wet etching. In this instance, the material used for the sacrificial layer 920 may be single-crystalline, polycrystalline or amorphous compound that is combined with nitrogen or oxygen such as GaN, InGaN, ZnO, InN, $In_2O_3$, ITO, $SnO_2$, $In_2O_3$, $Si_3N_4$, $SiO_2$, BeMgO, MgZnO, TiN, VN, CrN or TaN.

When the chemical etching is used for separating the selected supporting substrate, the sacrificial layer 920 may be formed of metal, alloy, solid solution, oxide, nitride or thermophilic organism that is able to separately eliminate the selected supporting substrate 910 via the chemical etching. In this instance, the selected supporting substrate 910 is naturally separated by eliminating of the sacrificial layer 920 and auxiliary laser lift-off may be omitted accordingly.

In the chemical etching process, the sacrificial layer 920 dissolves in wet etching solution such as acid, base or salt solution including HF, BOE, $H_2SO_4$, $HNO_3$, $H_3PO_4$, KOH, NHOH and KI and the selected supporting substrate is then separated and eliminated accordingly.

If the thickness of the heat sink support comprising of the metallic thick films 1010a and 1010b and the bonding layers 1020a and 1020b is sufficient mechanically and safely, for example, 80 μm or more, the following single-chip fabricating step may be performed without auxiliary support bonding process. However, if the thickness is mechanically insufficient, for example, less than 80 μm, an auxiliary bonding layer formed of metal, alloy or conductive adhesive may be provided although not shown in the drawings. After the auxiliary support is bonded to the metallic thick films by the auxiliary bonding layer as thick as required, the single-chip fabricating step may be performed.

In this instance, the auxiliary support may be formed of single crystalline or polycrystalline wafer having high thermal or electrical conductivity such as Si, Ge, SiGe, ZnO, GaN, AlGaN, GaAs, AlN or BeO, metallic foil such as Mo, Cu, Ni, Nb, Ta, Ti, Au, Ag, Cr, NiCr, CuW, CuMo or NiW, or a laminate structure such as Cu/Mo/Cu, Cu/W/Cu, Ni/Mo/Ni, Cu/Ti/Cu, Cu/AlN/Cu, Cu/Al2O3/Cu, Cu/GaAs/Cu or Cu/Si/Cu.

In addition, a selected supporting substrate separating step may be performed after a temporary support substrate is bonded to a surface of the first wafer by organic or inorganic bonding material.

Figure 16:
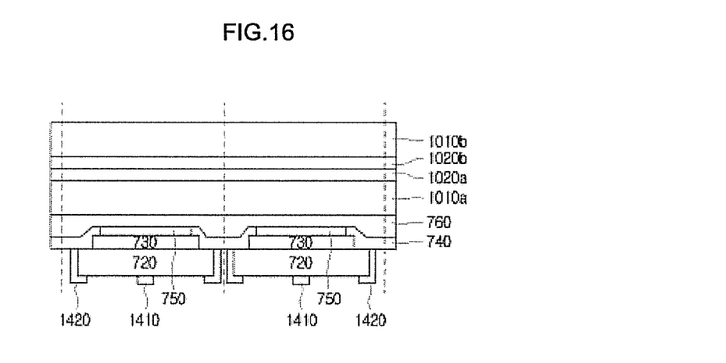
Figure 17:
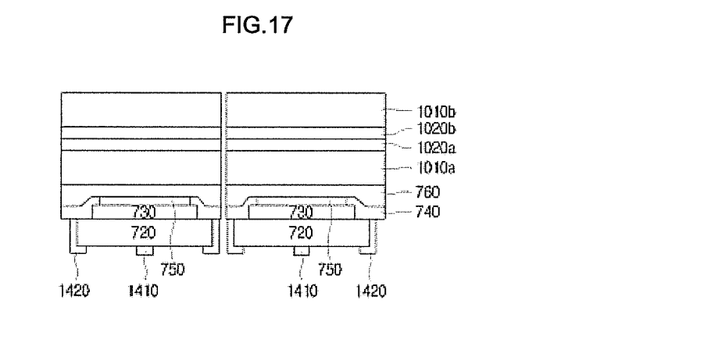

In the single chip fabricating step, the result from the bonding step to the selected supporting substrate separating step is vertically cur to fabricate a single chip.

FIG. 16 is a sectional view illustrating the single chip fabricating step.

In reference to FIG. 16, a single chip is completed via mechanical cutting such as laser scribing or sawing that is performed between the thin side passivation film 1420 isolated in a single chip shape. At this time, thermal degradation might be generated by micro-cracks and mechanical shocks within the multilayered light emitting structure thin film 720 and much heat generated in the laser scribing or sawing. This problem might be alleviated enough by shock absorption and heat dissipation performed by the metallic foil 812 or the first and second metallic thick films 1010a and 1010b provided in the semiconductor light emitting device according to the invention.

Second Embodiment of Method for Fabricating Vertical-Structure Semiconductor Light Emitting Device A method for fabricating the vertical-structure semiconductor light emitting device according to a second embodiment includes steps of preparing a first wafer; preparing metal foil; preparing a support substrate for fabricating a semiconductor light emitting device as a second wafer; bonding the first wafer, the metallic foil and the second wafer; separating a sapphire substrate of the first wafer; isolating a multilayered light emitting structure thin film; performing a post-first wafer process; separating a selected supporting substrate of the second wafer; and fabricating a single-chip.

In the metallic foil preparing step, a first' bonding layer and a second' bonding layer are formed on a top surface and a bottom surface of the metallic foil 812. the first wafer, the metallic foil and the second wafer are bonded to bond a first bonding layer formed under the first wafer with the first' bonding layer and a second bonding layer of the second wafer with the second' bonding layer. The second embodiment of the vertical-structure semiconductor light emitting device fabricated after that is shown in FIG. 6.

The fabricating method of the vertical-structure semiconductor light emitting device according to the second embodiment is similar to the fabricating method according to the first embodiment, except no metallic thick film provided in the first and second wafer.

Figure 8:
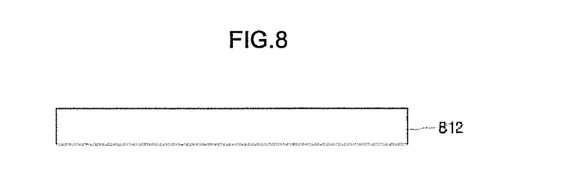
Figure 9:
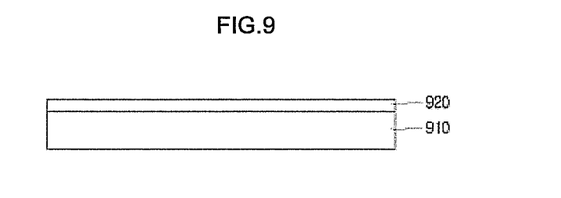

FIG. 8 is a sectional view illustrating the metallic foil 812 constituting the heat sink support mentioned above. The metallic foil 812 is formed of rolling metal, alloy or solid solution that has electrical and thermal conductivity, with a thickness of 0.1~999 μm or less and it may include at least one of Cu, Al, Ni, Nb, W, Mo, Ta, Ti, Au, Ag, Pd, Pt, Cr, Fe, V, Si and Ge.

When the thickness is mechanically insufficient, for example, 80 μm or less in the fabricating method according to the second embodiment, an auxiliary bonding layer formed of plated metal, alloy or conductive adhesive is provided and the auxiliary bonding layer may be used for bonding an auxiliary support to the metallic thick films as thick as required, before the single-chip fabricating step.

To enhance a bonding effect in the bonding step, an adhesion-enhancing layer may be formed before forming the first' bonding layer and the second bonding layer on the top and bottom surfaces of the metallic foil 812.

The support substrate, the vertical-structure semiconductor light emitting device and the fabricating method thereof are applicable to other fields. Especially, there may be a homoepitaxial III-V nitride based semiconductor growth substrate fabricating by growing the III-V nitride based semiconductor on the sapphire substrate, a vertical-structure laser diode using the multilayered light emitting structure thin film comprising of the nitride based semiconductors and various photoelectronic devices including a transistor.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The vertical-structure semiconductor light emitting device fabricated according to the invention may include the metallic foil or the high-performance heat sink support configured of the metallic foil. Accordingly, no micro-crack is generated. As the annealing and the post-processes for the thin side passivation film can be freely performed, the light emitting device may have high reliability without thermal and mechanical damage.

Furthermore, the method for fabricating the vertical-structure semiconductor light emitting device according to the invention may use the wet etching in the chip fabricating process. Accordingly, a chip yield may be enhanced remarkably in the chip fabricating process, compared with the chip fabricating process using the conventional mechanical and laser process, and the good quality nitride-based semiconductor single-crystalline multilayered thin film may be achievable via the enhanced wafer bonding. In addition, all of the post processes performed after the sapphire substrate separation may be performed freely. Accordingly, the light emitting device including the high-performance heat sink support configured of the metallic thick layer or the metallic foil may be provided effectively.

The invention claimed is:

1. A method for fabricating a semiconductor light emitting device comprising:
   (a) preparing a first wafer having a multilayered light emitting structure comprising III-V nitride based semiconductors, a second electrode, a first bonding layer formed on a growth substrate, further comprising:
      (a1) forming the second electrode directly on the light emitting structure;
      (a2) forming an insulative layer on the light emitting structure and the second electrode;
      (a3) forming a first conductive layer on the second electrode;
      (a4) forming a second conductive layer directly on the insulative layer and directly on the first conductive layer; and
      (a5) forming the first bonding layer directly on the second conductive layer;
   (b) preparing a first metallic layer having a second bonding layer thereon and a third bonding layer thereunder;
   (c) preparing a selected supporting substrate having a sacrificial layer, a second metallic layer and a fourth bonding layer formed thereon;
   (d) bonding the first wafer and the first metallic layer to bond the first bonding layer with the second bonding layer and bonding the first metallic layer and the selected supporting layer to bond the third bonding layer with the fourth bonding layer;
   (e) separating the growth substrate of the first wafer from a result of the (d) step;
   (f) isolating the light emitting structure exposed by the (e) step;
   (g) forming a first electrode on the light emitting structure isolated by the (f) step and forming a thin side passivation layer;
   (h) separating the selected supporting substrate from the second metallic layer; and
   (i) fabricating a single chip by vertically cutting a result of the (h) step.

2. The method for fabricating a semiconductor light emitting device according to claim 1, wherein the (h) step is performed after a temporary support substrate is bonded on a surface of the first wafer by an organic or inorganic bonding material.

3. The method for fabricating the semiconductor light emitting device according to claim 1, wherein after the (h) step, an auxiliary support is formed in a region where the selected supporting substrate and the sacrificial layer are eliminated.

4. The method for fabricating the semiconductor light emitting device according to claim 3, wherein the auxiliary support is formed of a single-crystalline or polycrystalline wafer selected from Si, Ge, SiGe, ZnO, GaN, AlGaN, GaAs, AlN and BeO, a metallic foil selected from Mo, Cu, Ni, Nb, Ta, Ti, Au, Ag, Cr, NiCr, CuW, CuMo and NiW or a laminate structure selected from Cu/Mo/Cu, Cu/W/Cu, Ni/Mo/Ni, Cu/Ti/Cu, Cu/AlN/Cu, Cu/Al$_2$O$_3$/Cu, Cu/GaAs/Cu and Cu/Si/Cu.

5. The method for fabricating the semiconductor light emitting device according to claim 1, wherein the structure of the (a) step comprises an n-type semiconductor cladding layer, a light emitting active layer and a p-type semiconductor cladding layer, and
   each of the layers is comprised of a single crystalline having a compositional formula: In$_x$(Ga$_y$Al$_{1-y}$)N(0≤x≤1, 0≤y≤1, x+y>0).

6. The method for fabricating the semiconductor light emitting device according to claim 1, wherein the first metallic layer of the (b) step is a plate-shaped metal, alloy or solid solution comprising at least one selected from a group consisting of Cu, Al, Ni, Nb, W, Mo, Ta, Ti, Au, Ag, Pd, Pt, Cr, Fe, V, Si and Ge.

7. The method for fabricating the semiconductor light emitting device according to claim 1, wherein in the (b) step, the second bonding layer and third bonding layer are formed after forming an adhesion-enhancing layer on a top surface and a bottom surface of the first metallic layer.

8. The method for fabricating the semiconductor light emitting device according to claim 1, wherein the sacrificial layer of the (c) step is formed according to any one of e-beam evaporation, thermal evaporation, MOCVD, sputtering or PLD (Pulsed Laser Deposition).

9. The method for fabricating the semiconductor light emitting device according to claim 1, wherein the first metallic layer of the (b) step has a thickness of 0.1~999 μm.

10. The method for fabricating the semiconductor light emitting device according to claim 1, wherein the first metallic layer is formed by electroplating or electroless-plating.

11. The method for fabricating the semiconductor light emitting device according to claim 1, wherein the (d) step is performed at 100° C.~600° C. under 1~200 MPa by thermal compression bonding.

12. The method for fabricating the semiconductor light emitting device according to claim 1, wherein in the (e) step, chemo-mechanical polishing or wet etching is performed after a Laser Lift-Off.

13. The method for fabricating the semiconductor light emitting device according to claim 1, wherein in the (h) step, the selected supporting substrate is separated by using the Laser Lift-Off or by eliminating the sacrificial layer through chemical etching.

14. The method for fabricating the semiconductor light emitting device according to claim 1, wherein before forming the second electrode in the (a) step or forming the first electrode in the (g) step, extraction structure layer by unevenness or patterning is further provided or an aluminum film nano-grid polarizer is further provided.

15. The method for fabricating the semiconductor light emitting device according to claim 1, wherein the light emitting structure of the (a) step grows according to metal organic chemical vapor (MOCVD), liquid phase epitaxy, hydride vapor phase epitaxy, Molecular beam epitaxy, or metal organic vapor phase epitaxy (MOVPE).

16. A method for fabricating a semiconductor light emitting device comprising:
- (a) preparing a light emitting structure comprising III-V nitride based semiconductors on a growth substrate, a second electrode layer directly on the light emitting structure and a first metallic layer on the second electrode layer, an insulative layer on the light emitting structure and the second electrode, a first conductive layer on the second electrode, a second conductive layer directly on the insulative layer and the first conductive layer, a first bonding layer directly on the second conductive layer;
- (b) preparing a selected supporting substrate having a sacrificial layer and a metallic layer;
- (c) bonding the first metallic layer and a second metallic layer with each other;
- (d) separating the growth substrate;
- (e) forming a first electrode layer on the light emitting structure and a passivation layer on a side of the light emitting structure; and
- (f) separating the selected supporting substrate from the second metallic layer.

17. The method for fabricating the semiconductor light emitting device according to claim 16, wherein a diffusion barrier layer and an adhesion-enhancing layer are provided in the second conductive layer.

18. A method for fabricating a semiconductor light emitting device comprising:
- preparing a light emitting structure comprising a first semiconductor layer, an active layer and a second semiconductor layer on a growth substrate, a second electrode layer directly on the light emitting structure and a first metallic layer on the second electrode layer, an insulative layer on the light emitting structure and the second electrode, a first conductive layer on the second electrode, a second conductive layer directly on the insulative layer and the first conductive layer, a first bonding layer directly on the second conductive layer;
- preparing a support substrate comprising bonding layer;
- preparing a selected supporting substrate comprising a sacrificial layer and a second metallic layer;
- bonding the light emitting structure and the support substrate with each other and bonding the support substrate and the second metallic layer with each other;
- separating the growth substrate;
- forming a first electrode layer on the light emitting structure exposed by the separation of the growth substrate; and
- separating the selected supporting substrate from the second metallic layer.

* * * * *